(12) United States Patent
Plaudet-Hammani et al.

(10) Patent No.: US 11,094,098 B2
(45) Date of Patent: Aug. 17, 2021

(54) METHOD FOR CREATING AN ANIMATION SUMMARIZING A DESIGN PROCESS OF A THREE-DIMENSIONAL OBJECT

(71) Applicant: Dassault Systemes, Velizy Villacoublay (FR)

(72) Inventors: Amal Plaudet-Hammani, Velizy (FR); Christophe Rene Francis Delfino, La Colle sur Loup (FR); Romain Perron, Paris (FR)

(73) Assignee: Dassault Systemes, Velizy Villacoublay (FR)

( * ) Notice: Subject to any disclaimer, the term of this patent is extended or adjusted under 35 U.S.C. 154(b) by 0 days.

(21) Appl. No.: 16/145,452

(22) Filed: Sep. 28, 2018

(65) Prior Publication Data
US 2019/0114820 A1  Apr. 18, 2019

(30) Foreign Application Priority Data
Oct. 13, 2017  (EP) .................................... 17306394

(51) Int. Cl.
| | |
|---|---|
| *G06T 13/20* | (2011.01) |
| *G06F 30/00* | (2020.01) |
| *G06T 11/20* | (2006.01) |
| *G06T 19/20* | (2011.01) |

(52) U.S. Cl.
CPC .............. *G06T 13/20* (2013.01); *G06F 30/00* (2020.01); *G06T 11/206* (2013.01); *G06T 19/20* (2013.01); *G06T 2200/24* (2013.01); *G06T 2213/12* (2013.01); *G06T 2219/2008* (2013.01); *G06T 2219/2016* (2013.01)

(58) Field of Classification Search
CPC ...... G06T 13/20; G06T 2213/12; G06F 17/50
See application file for complete search history.

(56) References Cited

U.S. PATENT DOCUMENTS

| | | | |
|---|---|---|---|
| 8,941,666 B1 | 1/2015 | Kovar | |
| 2010/0037178 A1* | 2/2010 | Queric | ................ G06F 3/04845 715/836 |
| 2012/0110595 A1* | 5/2012 | Reitman | ................. G06F 30/00 719/313 |

(Continued)

OTHER PUBLICATIONS

European Search Report for International Application No. EP 17 30 6394, entitled "Method for Creating an Animation Summarizing A Design Process of a Three-Dimensional Object," consisting of 6 pages, dated Apr. 30, 2018.

*Primary Examiner* — Samantha (Yuehan) Wang
(74) *Attorney, Agent, or Firm* — Hamilton, Brook, Smith & Reynolds, P.C.

(57) ABSTRACT

A computer-implemented method for creating an animation summarizing a design process of a three-dimensional object, comprising the steps of: a) acquiring design data during at least one design session; b) automatically identifying time points of said session or sessions corresponding to milestones of the design process, and storing data representing statuses of the three-dimensional object at said milestones; and c) generating and displaying an animation of the design process, including displaying a graphical representation of a timeline (B) providing access to milestone data. A computer program product, non-transitory computer-readable datastorage medium and computer system for carrying out such a method.

14 Claims, 4 Drawing Sheets

(56) References Cited

U.S. PATENT DOCUMENTS

| | | | |
|---|---|---|---|
| 2015/0138194 A1* | 5/2015 | Kang | G06F 17/5004 |
| | | | 345/419 |
| 2015/0163206 A1* | 6/2015 | McCarthy | H04L 63/104 |
| | | | 713/171 |
| 2016/0147430 A1* | 5/2016 | Bergin | G06F 16/444 |
| | | | 715/765 |

* cited by examiner

0:05  Significant bounding box size change

0:16  Parts inserted

0:21  Shared to community

0:42  Delete numerous elements

1:08  Template Screw

1:14  Large scale update

METHOD FOR CREATING AN ANIMATION SUMMARIZING A DESIGN PROCESS OF A THREE-DIMENSIONAL OBJECT

RELATED APPLICATION(S)

This application claims priority under 35 U.S.C. § 119 or 365 to Europe, Application No. 17306394.2, filed Oct. 13, 2017. The entire teachings of the above application(s) are incorporated herein by reference.

FIELD OF INVENTION

The invention relates to a computer-implemented method for generating and displaying an animation summarizing the design process of a three-dimensional object.

It applies to the field of computer graphics, and more particularly of Computer Aided Design (CAD).

BACKGROUND

Three-dimensional design (e.g. of mechanical parts of assembly, buildings, items of manufacture etc.) is a complex and lengthy process. Moreover, most of the time, it is not a linear process: the designer has to experiment several different approaches before finding a satisfying one, slowly converging to the final result. Particularly if the design is part of a wider project involving several people, it may be useful to keep a track of the unfolding of the design process, e.g. to share it with colleagues or to report to a manager.

To this aim, the designer can take screenshot of his or her work, and edit them in a static document or, preferably, a video, for instance using software tools such as "Camtasia" (registered trademark) by TechSmith Corporation. This is tedious and time consuming. Moreover, it is highly subjective: it is up to the designer to decide which time points of the design flow are relevant—and therefore worth of being documented—and which one may be ignored.

Additionally, a design activity report according to the prior art—be it in the form of a static document or of a video—is passive: it can only be looked at, but does not allow the viewer to interact with different versions of an object developed in the course of the design process. At most, the designer may provide a separate access to these data, which further increases his or her burden.

SUMMARY

The invention aims at overcoming these drawbacks by providing an automated method of generating an animation summarizing a design process of a three-dimensional object according to objective criteria, and by simultaneously providing direct access to relevant three-dimensional design data.

The invention achieves this aim by applying predetermined rules to design data acquired during one or more design sessions to identify "milestones" of the design process. Data representing the status of the designed object at the milestone are stored and interpolated to generate an animation; moreover, said data are made available for a spectator of the animation.

In a completely different field the application Strava, by Strava Inc., analyzes the sport performances of the user, monitored by GPS and different sensors, and uses them to select images which are included in a visual template and animated to generate a video. This approach is unsuitable to an application to three-dimensional design, where only "raw", unsorted and unlabeled design data are available.

It is also known to record and replay the movements of the mouse cursors and the clicks of a visitor on a website, which is very useful for web marketing; see for instance the Session Recording tool by Beam Pulse. Such a tool is also unsuitable to an application to three-dimensional design: user sessions are completely recorded, without selecting "milestones", which would lead to an unacceptably long animation; there is no editing; only user actions are recorded, and not other kind of data such as design data.

An object of the present invention is then a computer-implemented method for creating an animation summarizing a design process of a three-dimensional object, the method comprising the steps of:

a) acquiring design data during at least one design session of said three-dimensional object;

b) automatically identifying time points of said session or sessions corresponding to milestones of the design process by applying a set of predetermined rules to the acquired data, and storing data representing statuses of the three-dimensional object at said time points; and d) generating and displaying an animation of the design process from said stored statuses of the three-dimensional object, including displaying a graphical representation of a timeline providing access to data representing statuses of the three-dimensional object corresponding to milestones.

According to particular embodiments of such a method:

Step a) may comprise acquiring data representing at least one of: navigation data, actions performed by a user on a user interface, design commands provided by a user, product lifecycle management data, administrator's rights and three-dimensional design data.

The rules applied during step b) may include at least one among rules based on: an elapsed time since a start of the design process or a previous milestone; a number of parts of the three-dimensional object impacted by a change; a change of a number of parts of the three-dimensional object; a change of a size or shape of a bounding box of the three-dimensional object or of a part thereof; a number of repetitions of a same action; detection of an update or saving action; detection of a sharing or publication action; detection of a template creation; detection of a modification of the three-dimensional object by a user other than a principal user; detection of reuse of a part of the three-dimensional object; detection of a simulation performed on the three-dimensional object; and detection of a change proposed by an application.

Step b) comprises: applying a plurality of rules to the acquired data, each rule determining a weight, computing a sum of the weights determined by the rule, and identifying a milestone whenever said sum exceeds a threshold.

The method may further comprise a step of:

c) reconstructing and storing data representing intermediate statuses of the three-dimensional object by interpolating said data representing statuses of the three-dimensional object at the automatically identified time points;

said step c) being carried out between steps b) and d).

Step c) may comprise interpolating a plurality of numerical values representing properties of the three-dimensional object.

Step d) may comprise generating either a time-lapse video or an interactive three-dimensional animation.

Step d) may comprise displaying said graphical representation of a timeline alongside with previews of statuses of the three-dimensional object corresponding to milestones.

The method may further comprise a step of:

e) updating an already generated animation by taking into account subsequent design sessions.

The method may further comprise a step of:

f) selecting milestones to be discarded and cancelling data representing statuses of the three-dimensional object corresponding to said milestones to be discarded.

Said milestones to be discarded may be selected among milestones corresponding to time points preceding a current time point by at least a threshold time value.

Another object of the invention is a computer program product, stored on a non-transitory computer-readable data-storage medium, comprising computer-executable instructions to cause a computer system to carry out such a method.

Another object of the invention is a non-transitory computer-readable data-storage medium containing computer-executable instructions to cause a computer system to carry out such a method.

Another object of the invention is a computer system comprising a processor coupled to a memory and a graphical user interface, the memory storing computer-executable instructions to cause the computer system to carry out such a method.

Yet another object of the invention is an animation obtained by such a method.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

Additional features and advantages of the present invention will become apparent from the subsequent description, taken in conjunction with the accompanying drawings, wherein.

DETAILED DESCRIPTION

A description of example embodiments follows.

Hereafter, a "three-dimensional" (or "3D") object will designate the digital representation, in a computer system, of a physical object allowing a three-dimensional (3D) graphical representation. A 3D representation allows the viewing of the part from all angles. For example, a 3D object, when 3D represented, may be handled and turned around any of its axes, or around any axis in the screen on which the representation is displayed.

The term "object" will be construed in a broad sense, including an assembly or collection of a plurality of smaller object, calls "parts". An object must not necessarily be integrally formed, i.e. it may comprise disjoint parts.

Objects are created and modified during a design process, which involves design, saving, sharing etc. actions carried out by a user over one or more sessions—a session being defined as the time span between a "log-in" and a "log-out" to a design tool, and the activity performed during this time. The "status" of an object corresponds to the object as it is at a given time point of the design process. The status of an object is completely defined by a set of digital data.

"Design data" means all data generated during a design process, including both data constituting the result of the process (e.g. the designed 3D object and contextual information thereof) and data describing the unfolding of the process (e.g. identifying actions and commands by the user).

A "milestone" is a step, i.e. a time point, of a design process which is deemed particularly important according to some objective (i.e. rules-based) or subjective criteria. An object status and a set of design data may be associated to a design milestone.

"Animation" will designate both a "static" two-dimensional video, i.e. a succession of two-dimensional images at a predetermined rate, and a "dynamic" or "interactive" 3D animation, i.e. a succession of representations, e.g. on a computer screen, of 3D objects. Unlike a static video, an interactive 3D animation allows the user to handle and/or navigate the 3D object, to change a point of view etc.

In what follows, the terms "designer" and "user" will be employed interchangeably to designate a user of a Computer Aided Design system or program implementing the inventive method.

Figure 1:
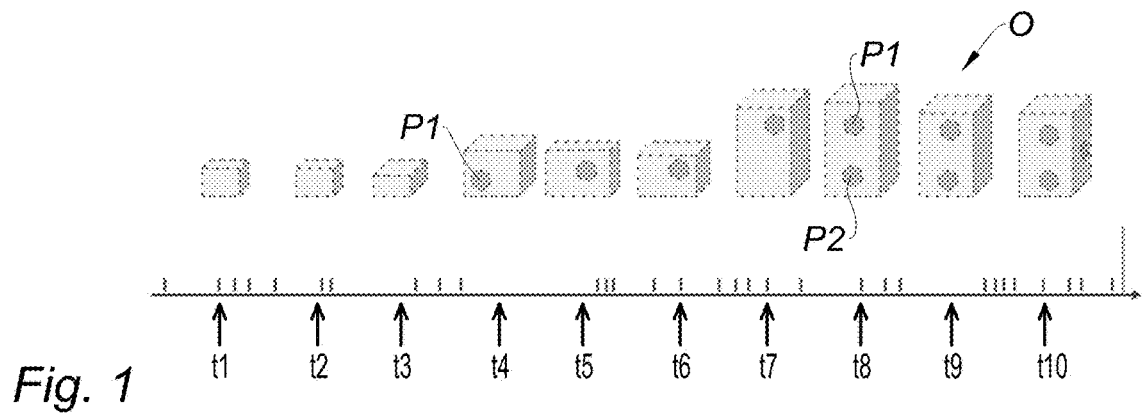
FIG. 1 represents the acquisition of design data during one or more design sessions.

As schematically illustrated on FIG. 1, the features—size, shape, list of parts—of a three-dimensional object O evolve during the unfolding of a computer-aided design process. For instance, at time t1 a parallelepiped object is created; at times t2 and t3 its height is changed; at time t4 a new part P1 is added near one of its corner; at times t5, t6 and t7 the position of this part is changed, and so is the height of object; at time t8 an additional part P2 is added; at times t9 and t10 the height of the object is changed again.

As the designer works, a background application records several kinds of data: navigation, interactions with a User Interface (UI), design commands (e.g. creation or modification of a part, freeform drawing, insertion of geometrical shapes . . . ), product lifecycle management data (including e.g. design data sharing, publication, import and/or export), changes in administrator's rights, and the three-dimensional design data generated by the CAD application in response to the user's actions. The collection and recording of these data is symbolically represented by short vertical lines on the timeline of FIG. 1. This corresponds to step a) of the flow-chart of FIG. 7.

The same or a different application then analyzes—in real time or not—the recorded data, and applies a set of criteria to identify and select some of them which are considered to represent "milestones" of the design process. The criteria may be "intrinsic"—i.e. relating to the evolution of the 3D object itself—or "extrinsic"—i.e. relating to events which are not directly related to the design process.

Examples of intrinsic criteria are:

a change of the object has impacted at least a predetermined number of parts—or at least a predetermined fraction of the existing parts;

the number of parts of the objects has changed by at least a predetermined amount or percentage;

the size of a bounding box containing the object or a part thereof has changed by at least a predetermined amount or percentage;

a part of the three-dimensional object has been reused.

Examples of extrinsic criteria are:

the elapsed time since the start of the design process, or the previous milestone, has exceeded a predetermined duration;

a same action has been repeated a predetermined amount of times;

an update, saving, sharing or publication action has been performed;

a template has been created;

the three-dimensional object has been modified by a user other than the one designated as the principal designer;

a simulation has been performed on the three-dimensional object, e.g. to test it; and an application has automatically proposed a modification of the object.

According to an embodiment of the invention, all these criteria are associated to a "weight", i.e. a numerical value. Whenever a criterion is met, the corresponding weight is added to a counter; when the counter exceeds a preset threshold, a milestone is detected and the counter is initialized. More complex approaches are possible; for instance, in some embodiment of the invention certain criteria must necessarily be met in order for a milestone to be identified.

Figure 2:
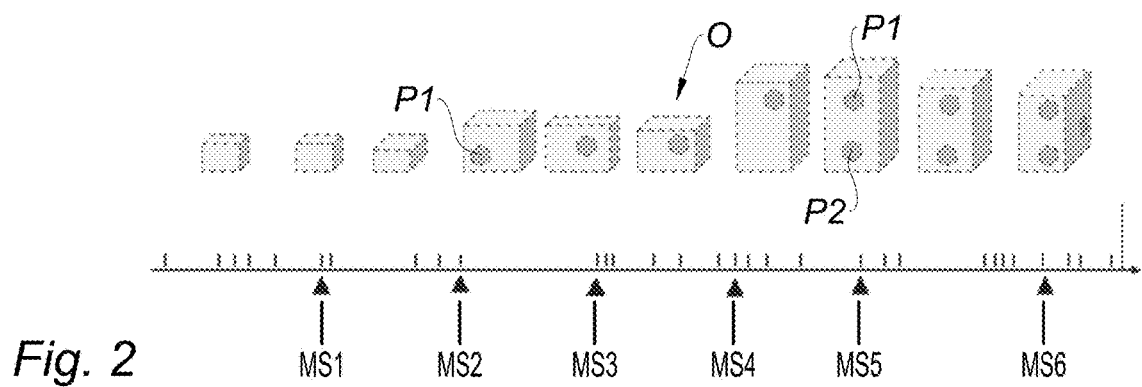
FIG. 2 represents the identification of design milestones.

On FIG. 2, six milestones (MS1, MS2, MS3, MS4, MS5, and MS6) are symbolically represented by triangles on a timeline.

Whenever a milestone is detected, data representing the corresponding status of the three-dimensional object are stored, together with an identifier of the milestone and, optionally, of the actual time at which the milestone has occurred. The milestone "weight" (i.e. the cumulated weight of all the criteria met since the previous milestone) may also be stored. This corresponds to step b) of the flow-chart of FIG. 7.

An animation only based on milestone statuses is likely to be jerky—except if an (often impractically) high number of milestones is identified per unit time. Therefore, additional "intermediate" object statuses are preferably created by interpolating between neighboring "milestone" statuses. The status of an object can be represented by a set of attributes taking numerical values. The intermediate statuses are obtained by interpolating the numerical values of the attributes of neighboring statuses.

Figure 3:
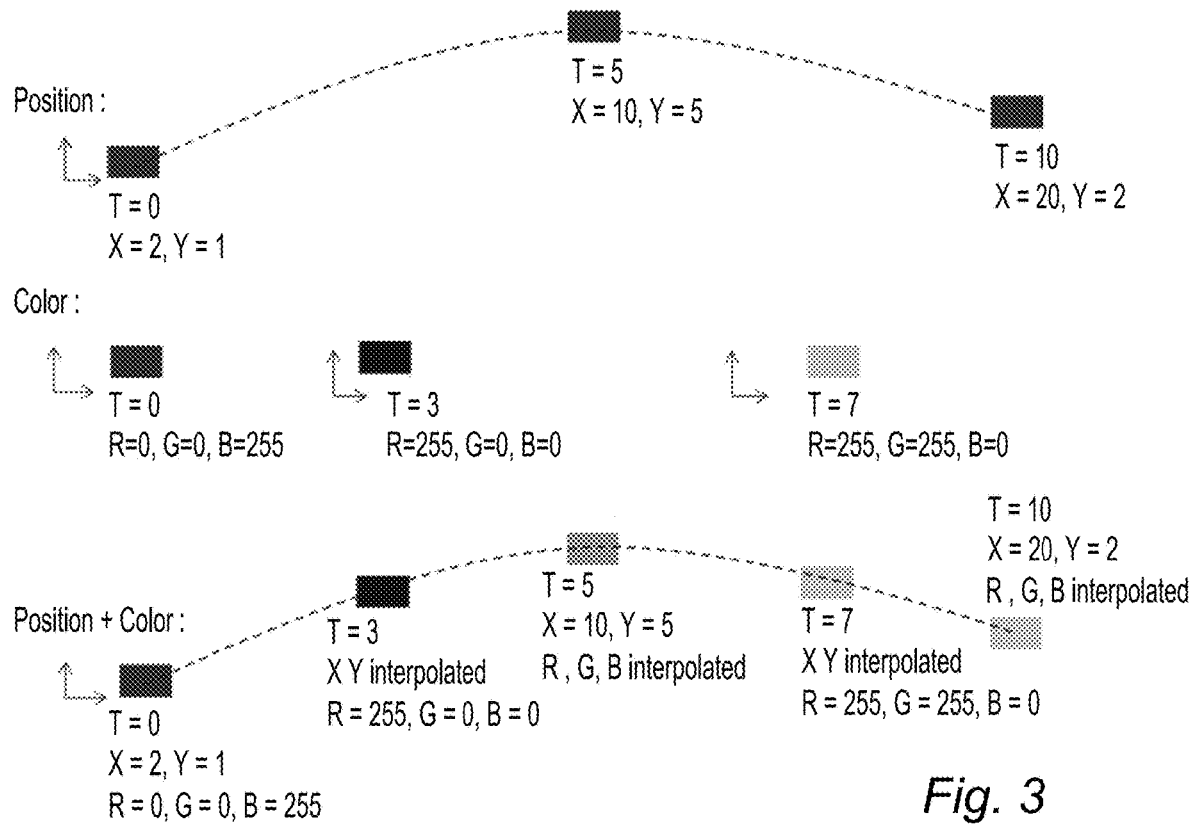
FIG. 3 represents the reconstruction of intermediate statuses of a three-dimensional object by interpolating milestone data.

The interpolation operation is schematically illustrated on FIG. 3. This figure refers to a very simplified case wherein the only attributes defining the statuses of the designed 3D object are its position expressed by coordinates X and Y, its color expressed by chromatic coordinates R (red), G (green), B (blue). All these attributes are supposed to take positive integer values. Moreover, each status is labeled by a time T. Times T=0, 3, 5, 7 and 10 correspond to logged operations, wherein either the position or the color of the object is recorded. Moreover, times T=3 and T=10 correspond to milestones.

Before interpolation:
At time T=0, X=2, Y=1, R=0, G=0, B=255.
At time T=3, position is undefined, R=255, G=0, B=0.
At time T=5, X=10, Y=5, color is undefined.
At time T=7, position is undefined, R=255, G=255, B=0.
At time T=10, X=20, Y=10, color is undefined.
After interpolation:
At time T=0, X=2, Y=1, R=0, G=0, B=255 (no change).

At time T=3, X=6 (interpolation between X=2 at T=0 and X=10 at T=5), Y=3 (interpolation between Y=3 at T=0 and Y=5 at T=5) R=255, G=0, B=0.
At time T=5, X=10, Y=5, R=255, G=128, B=0 (chromatic coordinates interpolated between their values at T=3 and T=7).
At time T=7, X=15, Y=4 (position coordinates interpolated between their values at T=5 and T=10), R=255, G=255, B=0.
At time T=10, X=20, Y=2, R=255, G=255, B=0).

Figure 7:
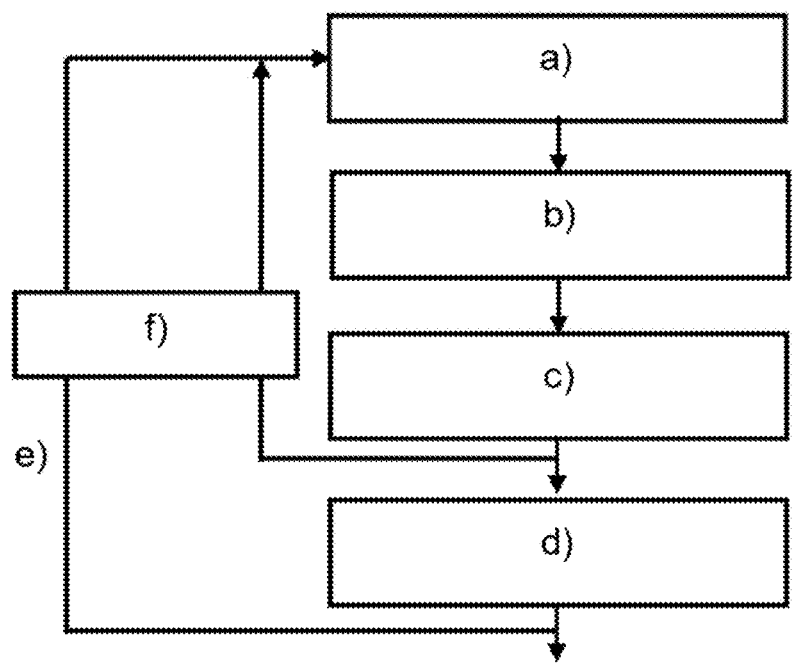
FIG. 7 is a flow-chart of a method according to an embodiment of the invention.

This corresponds to step c) of the flow-chart of FIG. 7.

Figure 4:
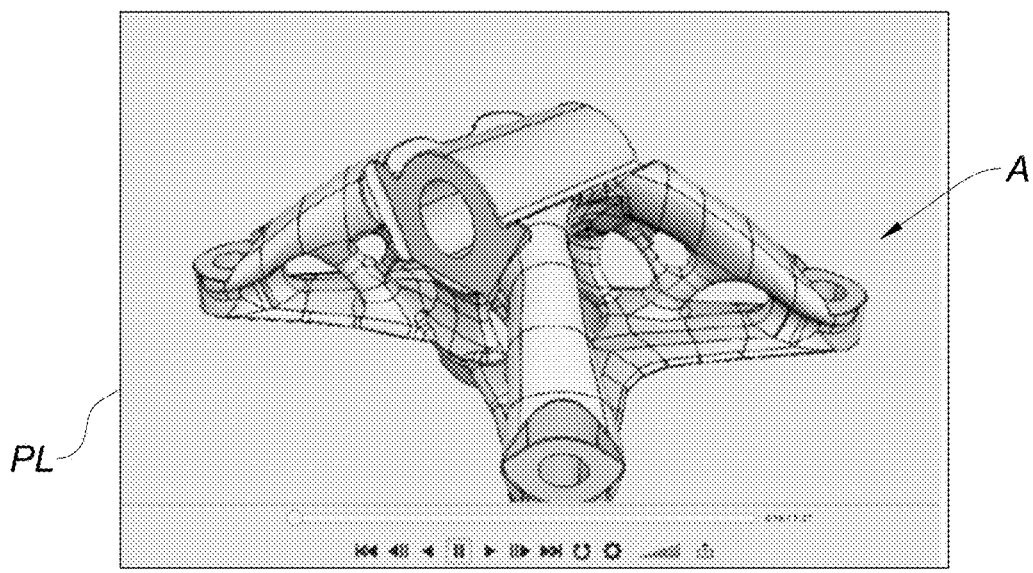
FIG. 4 is a screenshot of an animation generated according to an embodiment of the invention.

After that several "milestone" have been identified and intermediate statuses computed (see the inner loop on FIG. 7), they are used to generate an animation summing up the whole design process, which is then usually stored on a non-transitory computer-readable data-storage medium. In the simplest embodiment of the invention, the animation is simply a time-lapse video—i.e. a series of 2D images of the 3D object taken by a predetermined point of view, which is usually fixed but may also vary in time following a predefined trajectory. The video (reference A) may then be played using a conventional player application PL, as shown on FIG. 4. Alternatively, in more complex embodiments, it may be a dynamic, interactive 3D animation, as defined above.

In all cases, the animation is accompanied by the graphical representation of a timeline highlighting milestones and providing direct access to the corresponding milestones design data.

Figure 5:
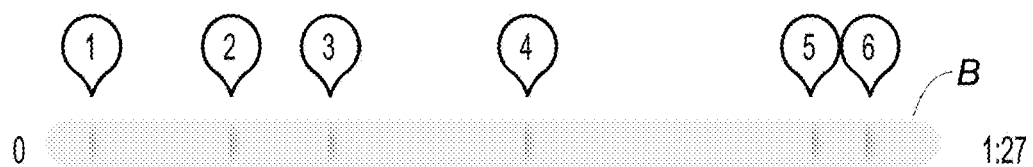
FIG. 5 represents a timeline displayed alongside the animation of FIG. 4.
Figure 5:
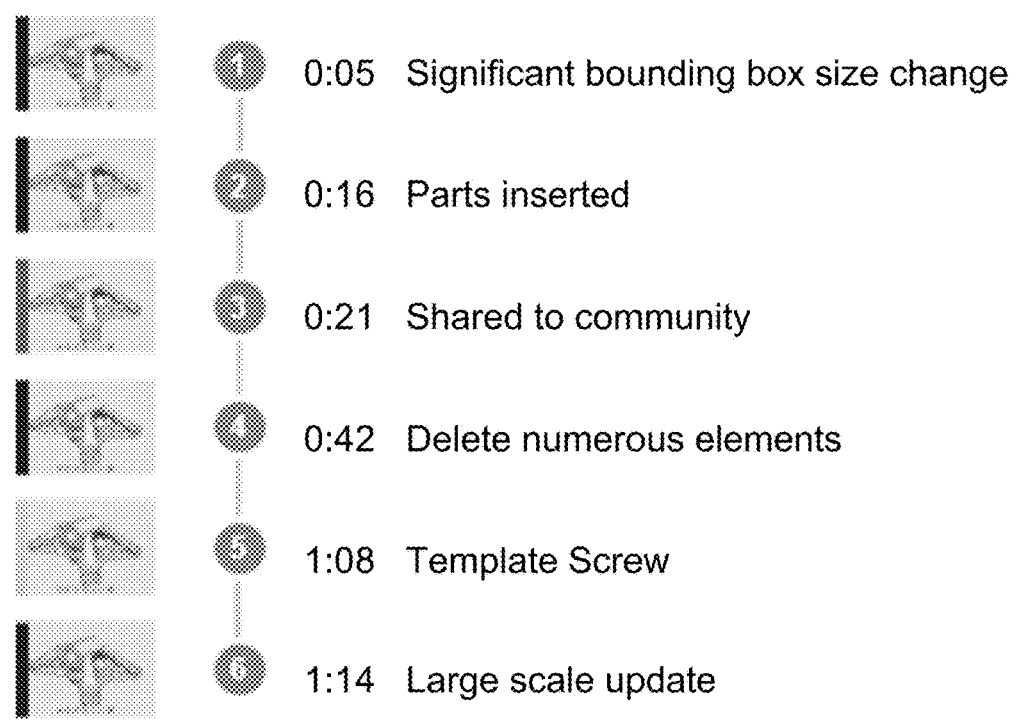

In the exemplary embodiment of FIG. 5, the timeline is represented by a horizontal bar B and milestones are represented by "inverted drop" markers carrying a milestone number. Under this bar, the milestone numbers are reproduced, accompanied by a preview PV of the corresponding milestone status, a synthetic definition of the milestone, and possibly a temporal indication.

The preview is a small, reduced-resolution image of the object in the corresponding milestone status. The description is automatically generated by identifying the main criterion or criteria having led to the identification of the milestone. For instance, milestone 1, achieved after 5 minutes of design work (in a single or several design sessions) has mainly been identified due to a significant change of the size of the bounding box of the object; milestone 2, achieved after 16 minutes, to the insertion of several new parts; milestone 3, achieved after 21 minutes, the sharing of the partially-designed object to a community of users; milestone 4, achieved after 42 minutes, to the deletion of several elements; milestone 5, achieved after 1 hour 8 minutes to the use of a template for a part of the object under design, and more particularly a screw; milestone 6, achieved after 1 hour 14 minutes, to a large scale update.

By clicking on a milestone number, or on the corresponding preview, design data defining the corresponding object status are retrieved and uploaded. The user may then e.g. begin a new design process starting from a previously achieved status.

This corresponds to step d) of the flow-chart of FIG. 7.

Usually, the animation generation will be triggered by a specific user action. Advantageously, however, data acquisition, milestone identification and intermediate statuses computation continues even after the generation of a first animation. Otherwise stated, if the design process continues, the animation keeps evolving. This corresponds to the outer loops "e") on the flow-chart of FIG. 7.

According to an advantageous embodiment of the invention, some milestones are discarded over time in order to reduce the amount of stored data. Typically, all milestones within a "protected window" PW, extending backwards from a present time PT by a predetermined duration, are kept. Older milestones are dropped according to predetermined criteria. For instance, milestones outside the protected window having a weight lower than a first threshold may be suppressed, and their weight be "inherited" by the following milestone. The threshold may increase with time, in which case the older a milestone is, the greater its weight must be in order to avoid suppression. Advantageously, milestones whose weight exceeds a second threshold greater than the first one are never suppressed, whatever their age.

Figure 6A:
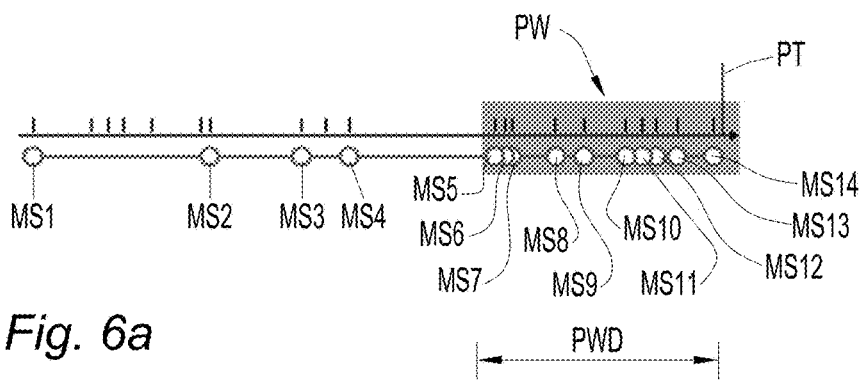
FIGS. 6a and 6b represent the discarding of selected milestones outside a protected region.
Figure 6B:
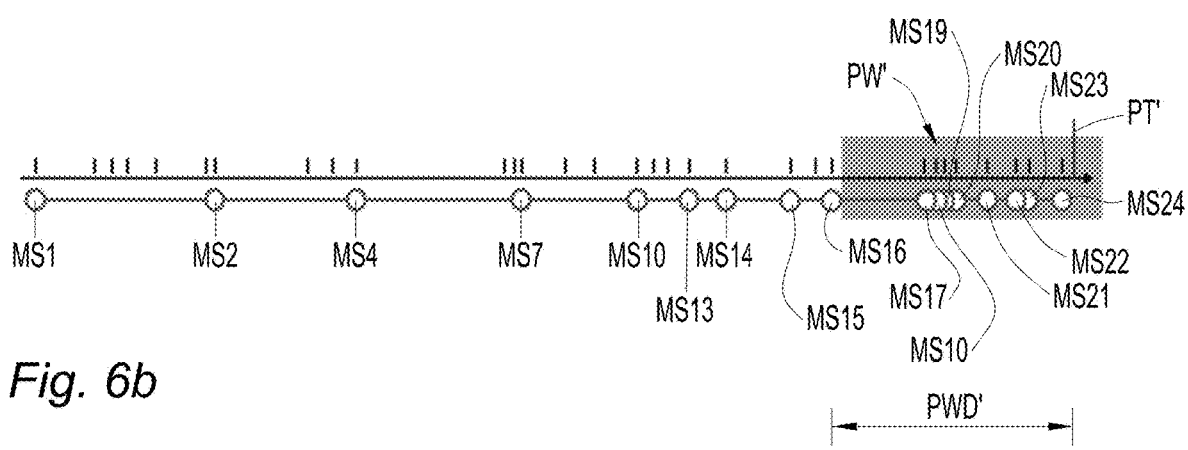

For instance, FIG. 6a shows 14 milestones over a timeline. Milestones MS5, MS6, MS7, MS8, MS9, MS10, MS11, MS12, MS13 and MS14 belong to protected window PW, which extend backwards from present time PT by duration PWD. FIG. 6b shows the same timeline at a later time. The protected window PW' has shifted, and extends backwards from the new "present time" PT' by duration PWD' which may be different from PWD. Milestones MS3, MS4, MS5, MS6, M8, MS9, MS11, and MS12 have been discarded, while milestones MS1, MS2, MS4, MS7, MS10, MS13 and MS14 have been kept. Additional milestones have been acquired in the meantime: MS15, MS16, MS17, MS18, MS19, MS20, MS21, MS22, MS23 and MS24. Milestones MS16 to MS24 belong to the new protected window.

The discarding of "old" milestones corresponds to step f) of the flow-chart of FIG. 7.

The inventive method can be performed by a suitably-programmed general-purpose computer or computer system, possibly including a computer network, storing a suitable program in non-transitory form on a computer-readable medium such as a hard disk, a solid state disk or a CD-ROM and executing said program using its microprocessor(s) and memory.

Figure 8:
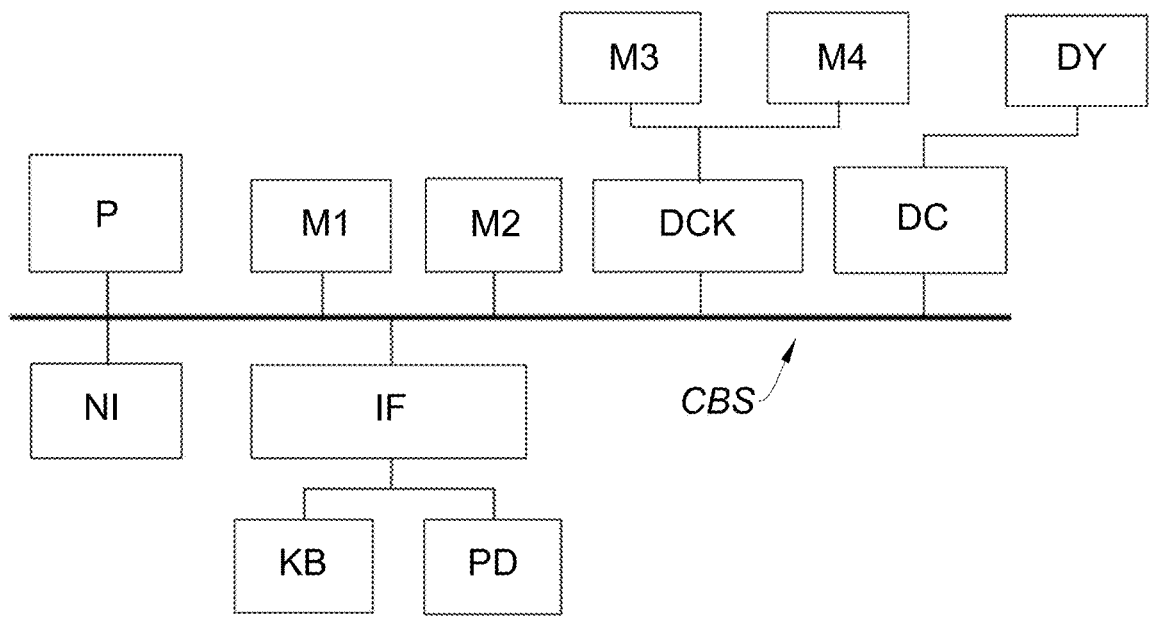
FIGS. 8 and 9 are block diagrams of respective computer systems suitable for carrying out a method according to different embodiments of the invention.

A computer suitable for carrying out a method according to an exemplary embodiment of the present invention is described with reference to FIG. 8. In FIG. 8, the computer includes a Central Processing Unit (CPU) P which performs the method step described above while running an executable program, i.e. a set of computer-readable instructions, stored in a memory device such as RAM M1 or ROM M2 or hard disk drive (HDD) M3, DVD/CD drive M4, or stored remotely. Moreover, one or more computer files defining statuses of the three-dimensional object and/or the generated animation may also be stored on one or more of memory devices M1 to M4, or remotely.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU P and an operating system such as Microsoft VISTA, Microsoft Windows 8, UNIX, Solaris, LINUX, Apple MAC-OS and other systems known to those skilled in the art.

CPU P can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer in FIG. 8 also includes a network interface NI, such as an Intel Ethernet PRO network interface card from Intel Corporation of America, for interfacing with a network, such as a local area network (LAN), wide area network (WAN), the Internet and the like. The computer further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands—e.g. to move the pointer—and by the computer for displaying the three-dimensional scene and the graphical tool.

Disk controller DKC connects HDD M3 and DVD/CD M4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

Figure 9:
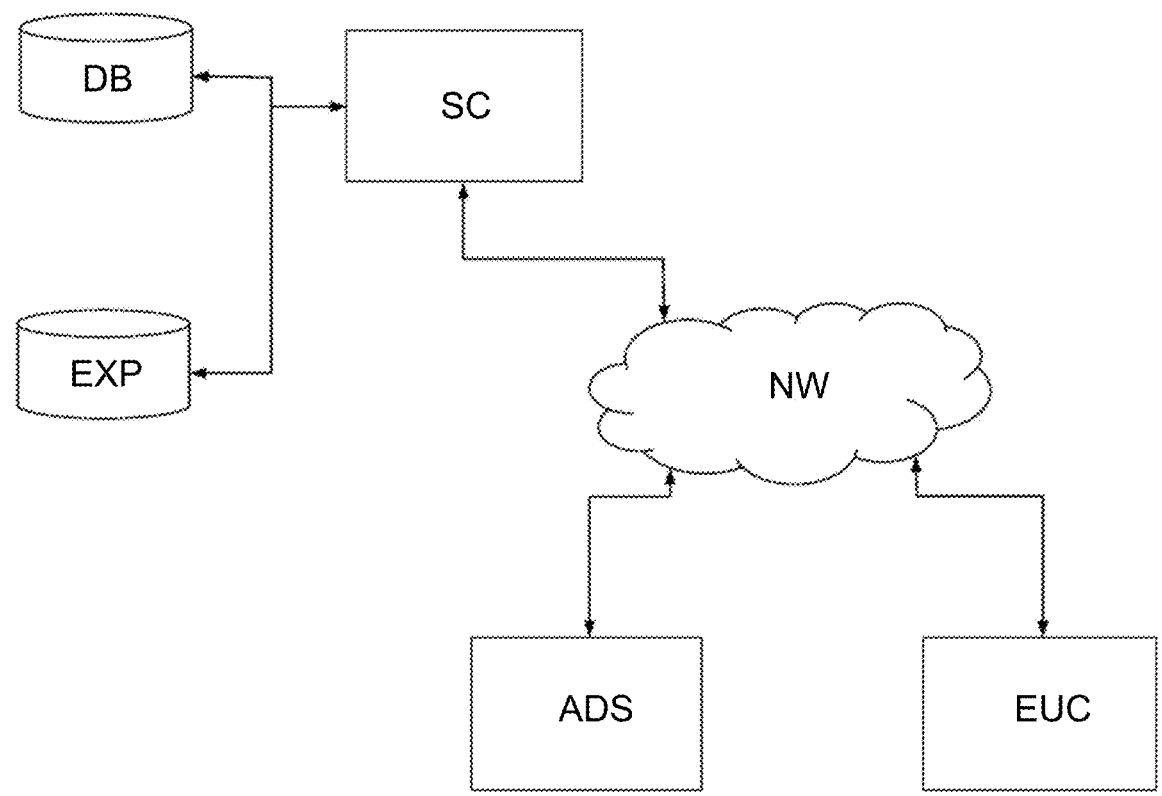

FIG. 9 is a block diagram of a computer system suitable for carrying out a method according to a different exemplary embodiment of the present invention.

In FIG. 9, the executable program EXP and the computer files defining statuses of the three-dimensional object and/or the generated animation are stored on memory devices connected to a server SC. The memory devices and the overall architecture of the server may be the same as discussed above with reference to FIG. 8, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 8, except that the memory devices of the administrator system and the end user computer do not store the executable program EXP and/or the computer files defining statuses of the three-dimensional object and/or the generated animation. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing computer files defining statuses of the three-dimensional object and/or the generated animation. This allows an end user to access said file, perform design operations, display the animation and so on. The server performs the processing as described above, and transmits to the end user computer image files corresponding to representations of the three-dimensional object and/or of the animation, again using the network NW.

Although only one administrator system ADS and one end user system EUX are shown, the system can support any number of administrator systems and/or end user systems without limitation. Similarly, multiple servers can also be implemented in the system without departing from the scope of the present invention Any method steps described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.]

While example embodiments have been particularly shown and described, it will be understood by those skilled in the art that various changes in form and details may be made therein without departing from the scope of the embodiments encompassed by the appended claims.

What is claimed is:

1. A computer-implemented method for creating an animation summarizing a design process of a three-dimensional object, said design process being carried out using a design tool, the method comprising the steps of:
  a) acquiring design data, by a background application, during a design session of said three-dimensional object, the design session corresponding to a time span between a log-in and a log-out of a user to the design tool, and the design data corresponding to data generated during the design process;
  b) automatically selecting time points of said session or sessions corresponding to milestones of the design process by applying a set of predetermined rules to the acquired data, and storing data representing statuses of the three-dimensional object at said time points, said set of predetermined rules comprising at least one rule representative of:
    the detection of an elapsed time since a start of the design process or a previous milestone;
    a detection that an amount of change of at least one feature of the three-dimensional object is above at least one threshold; or
    a detection of an occurrence of at least one predefined action belonging to a predefined subset of possible actions from a user;
  c) reconstructing and storing data representing intermediate statuses of the three-dimensional object by performing a time-based interpolation of a plurality of numerical values representing properties of the three-dimensional object at a time between the automatically selected time points;
  and
  d) generating and displaying an animation of the design process from said stored statuses of the three-dimensional object, including displaying a graphical representation of a timeline providing access to data representing statuses of the three-dimensional object corresponding to milestones.

2. The computer-implemented method of claim 1, wherein step a) comprises acquiring data representing at least one of: navigation data, actions performed by a user on a user interface, design commands provided by a user, product lifecycle management data, administrator's rights and three-dimensional design data.

3. The computer-implemented method of claim 1, wherein the rules applied during step b) include at least one among rules based on:
  an elapsed time since a start of the design process or a previous milestone;
  a number of parts of the three-dimensional object impacted by a change;
  a change of a number of parts of the three-dimensional object;
  a change of a size or shape of a bounding box of the three-dimensional object or of a part thereof;
  a number of repetitions of a same action;
  detection of an update or saving action;
  detection of a sharing or publication action;
  detection of a template creation;
  detection of a modification of the three-dimensional object by a user other than a principal user;
  detection of reuse of a part of the three-dimensional object;
  detection of a simulation performed on the three-dimensional object; and
  detection of a change proposed by an application.

4. The computer-implemented method of claim 1, wherein step b) comprises: applying a plurality of rules to the acquired data, each rule determining a weight, computing a sum of the weights determined by the rule, and selecting a time point corresponding to a milestone whenever said sum exceeds a threshold.

5. The computer-implemented method of claim 1, wherein step d) comprises generating a time-lapse video.

6. The computer-implemented method of claim 1, wherein step d) comprises generating an interactive three-dimensional animation.

7. The computer-implemented method of claim 1, wherein step d) comprises displaying said graphical representation of a timeline alongside with previews (PV) of statuses of the three-dimensional object corresponding to milestones.

8. The computer-implemented method of claim 1, further comprising a step of e) updating an already generated animation by taking into account subsequent design sessions.

9. The computer-implemented method of claim 1, further comprising a step of f) selecting milestones to be discarded and cancelling data representing statuses of the three-dimensional object corresponding to said milestones to be discarded.

10. The computer-implemented method of claim 9, wherein said milestones to be discarded are selected among milestones corresponding to time points preceding a current time point by at least a threshold time value.

11. A computer program product, comprising:
  a non-transitory computer-readable data-storage medium, storing computer-executable instructions for creating an animation summarizing a design process of a three-dimensional object, said design process being carried out using a design tool;

the computer-executable instructions including instructions that cause a computer system to:

a) acquire design data, by a background application, during a design session of said three-dimensional object, the design session corresponding to a time span between a log-in and a log-out of a user to the design tool, and the design data corresponding to data generated during the design process;

b) automatically selecting time points of said session or sessions corresponding to milestones of the design process by applying a set of predetermined rules to the acquired data, and store data representing statuses of the three-dimensional object at said time points comprising at least one rule representative of:

the detection of an elapsed time since a start of the design process or a previous milestone;

a detection that an amount of change of at least one feature the three-dimensional object is above at least one threshold; or a detection of an occurrence of at least one predefined action belonging to a predefined subset of possible actions from a user;

c) reconstructing and storing data representing intermediate statuses of the three-dimensional object by performing a time-based interpolation of a plurality of numerical values representing properties of the three-dimensional object at a time between the automatically selected time points;

and d) generate and display an animation of the design process from said stored statuses of the three-dimensional object, including displaying a graphical representation of a timeline providing access to data representing statuses of the three-dimensional object corresponding to milestones.

12. A non-transitory computer-readable data-storage medium comprising:

a memory area containing computer-executable instructions to cause a computer system to carry out creating an animation summarizing a design process of a three-dimensional object, said design process being carried out using a design tool;

the instructions including:

a) acquiring design data, by a background application, during a design session of said three-dimensional object, the design session corresponding to a time span between a log-in and a log-out of a user to the design tool, and the design data corresponding to data generated during the design process;

b) automatically selecting time points of said session or sessions corresponding to milestones of the design process by applying a set of predetermined rules to the acquired data, and storing data representing statuses of the three-dimensional object at said time points, said set of predetermined rules comprising at least one rule representative of:

the detection of an elapsed time since a start of the design process or a previous milestone;

a detection that an amount of change of at least one feature of the three-dimensional object is above at least one threshold; or a detection of an occurrence of at least one predefined action belonging to a predefined subset of possible actions from a user;

c) reconstructing and storing data representing intermediate statuses of the three-dimensional object by performing a time-based interpolation of a plurality of numerical values representing properties of the three-dimensional object at a time between the automatically selected time points;

and d) generating and displaying an animation (A) of the design process from said stored statuses of the three-dimensional object, including displaying a graphical representation of a timeline (B) providing access to data representing statuses of the three-dimensional object corresponding to milestones.

13. A computer system comprising:

a processor coupled to a memory and a graphical user interface;

the memory storing computer-executable instructions to cause the computer system to create an animation summarizing a design process of a three-dimensional object by:

a) acquiring design data, by a background application, during a design session of said three-dimensional object, the design session corresponding to a time span between a log-in and a log-out of a user to the design tool, and the design data corresponding to data generated during the design process;

b) automatically selecting time points of said session or sessions corresponding to milestones of the design process by applying a set of predetermined rules to the acquired data, and storing data representing statuses of the three-dimensional object at said time points, said set of predetermined rules comprising at least one rule representative of:

the detection of an elapsed time since a start of the design process or a previous milestone;

a detection that an amount of change of at least one feature of the three-dimensional object is above at least one threshold; or a detection of an occurrence of at least one predefined action belonging to a predefined subset of possible actions from a user;

c) reconstructing and storing data representing intermediate statuses of the three-dimensional object performing a time-based interpolation of a plurality of numerical values representing properties of the three-dimensional object at a time between the automatically selected time points; and d) generating and displaying an animation of the design process from said stored statuses of the three-dimensional object, including displaying a graphical representation of a timeline providing access to data representing statuses of the three-dimensional object corresponding to milestones.

14. A non-transitory computer readable storage medium storing the animation obtained by the method of claim 1.

* * * * *